(12) United States Patent
Kim et al.

(10) Patent No.: US 12,464,793 B2
(45) Date of Patent: Nov. 4, 2025

(54) NITRIDE SEMICONDUCTOR BUFFER STRUCTURE AND SEMICONDUCTOR DEVICE INCLUDING THE SAME

(71) Applicant: Samsung Electronics Co., Ltd., Suwon-si (KR)

(72) Inventors: Boram Kim, Suwon-si (KR); Jongseob Kim, Suwon-si (KR); Woochul Jeon, Suwon-si (KR); Joonyong Kim, Suwon-si (KR); Junhyuk Park, Suwon-si (KR); Jaejoon Oh, Suwon-si (KR); Sunkyu Hwang, Suwon-si (KR); Injun Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 291 days.

(21) Appl. No.: 18/306,341

(22) Filed: Apr. 25, 2023

(65) Prior Publication Data

US 2023/0343830 A1 Oct. 26, 2023

(30) Foreign Application Priority Data

Apr. 25, 2022 (KR) .................. 10-2022-0051029

(51) Int. Cl.
*H10D 62/815* (2025.01)
*H10D 30/47* (2025.01)
*H10D 62/85* (2025.01)
*H10D 62/854* (2025.01)

(52) U.S. Cl.
CPC ....... *H10D 62/8171* (2025.01); *H10D 30/475* (2025.01); *H10D 62/8503* (2025.01); *H10D 62/854* (2025.01)

(58) Field of Classification Search
None
See application file for complete search history.

(56) References Cited

U.S. PATENT DOCUMENTS

| 9,520,286 B2 | 12/2016 | Shikauchi et al. |
| 2009/0008647 A1 | 1/2009 | Li et al. |
| 2012/0261716 A1 | 10/2012 | Yanagihara |
| 2014/0001439 A1 | 1/2014 | Chen et al. |
| 2021/0367100 A1 | 11/2021 | Huang et al. |

FOREIGN PATENT DOCUMENTS

KR 10-1387543 B1 4/2014

OTHER PUBLICATIONS

C. Poblenz et al., "Effect of carbon doping on buffer leakage in AlGaN/GaN high electron mobility transistors", Journal of Vacuum Science & Technology B: Microelectronics and Nanometer Structures Processing, Measurement, and Phenomena 22, 1145 (2004).

*Primary Examiner* — Anthony Ho
(74) *Attorney, Agent, or Firm* — HARNESS, DICKEY & PIERCE, P.L.C.

(57) ABSTRACT

Provided are a nitride semiconductor buffer structure and a semiconductor device including the same. The buffer structure may include a plurality of buffer layers between a substrate and an active layer. The active layer may include a nitride semiconductor. The plurality of buffer layers may be stacked on each other on the substrate. Each of the plurality of buffer layers may have a super lattice structure and may include a doped nitride semiconductor. The plurality of buffer layers may have different compositions from each other. Adjacent buffer layers, among the plurality of buffer layers, may have different doping concentrations from each other.

20 Claims, 11 Drawing Sheets

NITRIDE SEMICONDUCTOR BUFFER STRUCTURE AND SEMICONDUCTOR DEVICE INCLUDING THE SAME

CROSS-REFERENCE TO RELATED APPLICATION

This application is based on and claims priority under 35 U.S.C. § 119 to Korean Patent Application No. 10-2022-0051029, filed on Apr. 25, 2022, in the Korean Intellectual Property Office, the disclosure of which is incorporated by reference herein in their entirety.

BACKGROUND

1. Field

The present disclosure relates to a nitride semiconductor buffer structure and/or a semiconductor device including the same.

2. Description of the Related Art

Research has been actively conducted to use a nitride semiconductor (e.g., GaN-based material) in a semiconductor device such as a high power device or a light-emitting device. In the case of implementing a semiconductor device by stacking a nitride semiconductor layer on a substrate rather than a nitride semiconductor substrate, a buffer structure may be required between the substrate and the nitride semiconductor layer in order to reduce and/or minimize defects caused by a differences in characteristics between a substrate material and a nitride semiconductor, for example, a difference in a lattice constant and a difference in a thermal expansion coefficient. When the buffer structure does not compensate for defects caused by the difference in characteristics between the substrate material and the nitride semiconductor, vertical robustness may be weakened, and the characteristics of an active layer may be degraded.

SUMMARY

The present disclosure provides a nitride semiconductor buffer structure and/or a semiconductor device including the same.

Additional aspects will be set forth in part in the description which follows and, in part, will be apparent from the description, or may be learned by practice of the presented embodiments of the disclosure.

According to an embodiment, a buffer structure may include a plurality of buffer layers between a substrate and an active layer. The active layer may include a nitride semiconductor. The plurality of buffers layer may be stacked on each other on the substrate. Each of the plurality of buffer layers may have a super lattice structure and may include a doped nitride semiconductor. The plurality of buffer layers may have different compositions from each other. Adjacent buffer layers from among the plurality of buffer layers may have different doping concentrations from each other.

In some embodiments, the plurality of buffer layers each may include a plurality of sub-buffer layers having different compositions from each other.

In some embodiments, the buffer structure may further include a first material layer between the substrate and the plurality of buffer layers.

In some embodiments, the first material layer may include a first nitride semiconductor.

In some embodiments, the buffer structure may further include a second material layer between the active layer and the plurality of buffer layers.

In some embodiments, the second material layer may include a second nitride semiconductor.

In some embodiments, each of the plurality of buffer layers may include at least one of AlN, GaN, AlGaN, InGaN, AlInN, and AlGaInN.

In some embodiments, the plurality of buffer layers may be doped with at least one of Mg, C, O, and Al.

In some embodiments, a doping concentration in the plurality of buffer layers may be greater than or equal to about $10^{17}$ cm$^{-3}$ and less than or equal to about $10^{21}$ cm$^{-3}$.

In some embodiments, a thickness of each buffer layer among the plurality of buffer layers may be greater than about 0 and less than about 5000 nm.

In some embodiments, the substrate may include at least one of Si, SiC, a silicon on insulator (SOI), GaN, GaAs, InP, diamond, and a Ge on insulator (GOI).

In some embodiments, the buffer structure may further include at least one intermediate layer between the plurality of buffer layers.

In some embodiments, the at least one intermediate layer may have a doping concentration the same as or different than doping concentrations of the adjacent buffer layers among the plurality of buffer layers.

In some embodiments, the at least one intermediate layer may include at least one of AlN, GaN, AlGaN, InGaN, AlInN, and AlGaInN.

In some embodiments, a thickness of each intermediate layer of the at least one intermediate layer may be in the range of about 50 nm to about 500 nm.

In some embodiments, the plurality of buffer layers may include a first buffer layer, a second buffer layer on the first buffer layer, and a third buffer layer on the second buffer layer. A doping concentration in the second buffer layer may be in a range between a doping concentration of the first buffer layer and a doping concentration of the third buffer layer.

In some embodiments, the plurality of buffer layers include a first buffer layer, a second buffer layer on the first buffer layer, and a third buffer layer on the second buffer layer. A doping concentration in the first buffer layer may be equal to a doping concentration of the third buffer layer.

According to an embodiment, a semiconductor device may include a substrate; an active layer on the substrate, the active layer including a nitride semiconductor; and a buffer structure between the substrate and the active layer. The buffer structure may include a plurality of buffer layers stacked on each other on the substrate. Each of the plurality of buffer layers may have a super lattice structure and may include a doped nitride semiconductor. The plurality of buffer layers may have different compositions from each other. Adjacent buffer layers among the plurality of buffer layers may have different doping concentrations from each other.

In some embodiments, the plurality of buffer layers each may include a plurality of sub-buffer layers having different compositions.

In some embodiments, the buffer structure may further include at least one intermediate layer between the plurality of buffer layers.

In some embodiments, the at least one intermediate layer may have a doping concentration the same as or different than doping concentrations of the adjacent buffer layers among the plurality of buffer layers.

In some embodiments, the buffer structure may further include a first material layer between the substrate and the plurality of buffer layers. The first material layer may include a first nitride semiconductor.

In some embodiments, the buffer structure may further include a second material layer between the active layer and the plurality of buffer layers. The second material layer may include a second nitride semiconductor.

In some embodiments, the plurality of buffer layers may include a first buffer layer, a second buffer layer on the first buffer layer, and a third buffer layer on the second buffer layer. A doping concentration in the second buffer layer may be in a range between a doping concentration of the first buffer layer and a doping concentration of the third buffer layer.

In some embodiments, the plurality of buffer layers include a first buffer layer, a second buffer layer on the first buffer layer, and a third buffer layer on the second buffer layer. A doping concentration in the first buffer layer may be equal to a doping concentration of the third buffer layer.

According to an embodiment, a buffer structure may include a single buffer layer between a substrate and an active layer, the single buffer layer including a nitride semiconductor, and stacked on the substrate, the single buffer layer having a super lattice structure and including a doped nitride semiconductor. The single buffer layer may have a same composition throughout a whole of the single buffer layer, and the single buffer layer may have a doping concentration that varies continuously according to a height of the single buffer layer.

In some embodiments, the buffer structure may further include a first material layer between the substrate and the single buffer layer.

In some embodiments, the first material layer may include a first nitride semiconductor.

In some embodiments, the buffer structure may further include a second material layer between the active layer and the single buffer layer.

In some embodiments, the second material layer may include a second nitride semiconductor.

In some embodiments, a semiconductor device may include the buffer structure. The buffer structure may be on the substrate and the active layer may be on the buffer structure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, example embodiments will be described in detail with reference to the accompanying drawings. In the following drawings, the same reference numerals refer to the same components, and the size of each component in the drawings may be exaggerated for clarity and convenience of description. Meanwhile, the embodiments described below are merely examples and various modifications are possible from these embodiments.

Hereinafter, the term "upper portion" or "on" may also include "to be present above, below, in the left and right sides on a non-contact basis" as well as "to be on the top, bottom, left, and right portions in directly contact with". The singular expression includes plural expressions unless the context clearly implies otherwise. In addition, when a part "includes" a component, this means that it may further include other components, not excluding other components unless otherwise opposed.

The use of the term "above" or "the" and similar indicative terms may correspond to both singular and plural. If there is no explicit description or contrary description of the steps constituting the method, these steps may be carried out in an appropriate order and are not necessarily limited to the described order.

In addition, the terms " . . . part", " . . . portion", "module", and the like as used in the specification refer to the unit that processes at least one function or action, which may be implemented in hardware or software, or as a combination of hardware and software.

The connections or connection members of the lines between the components shown in the drawings illustrate, in some examples, functional connection and/or physical or circuit connections, which may be replaced in an actual device or may be represented as various functional connections, physical connections, or circuit connections.

The use of all examples or example terms is simply for describing a technical idea in detail and the scope is not limited by these examples or example terms unless limited by the claims.

Figure 1:
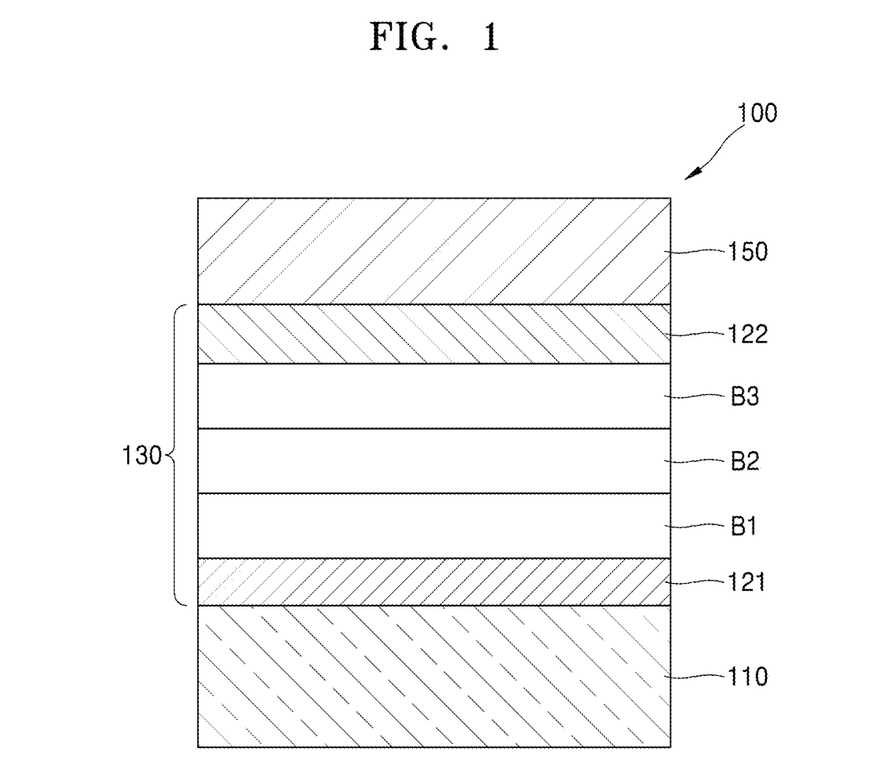
FIG. 1 illustrates a semiconductor device including a buffer structure according to an example embodiment.

FIG. 1 illustrates a semiconductor device 100 including a buffer structure according to an example embodiment. The semiconductor device 100 shown in FIG. 1 may be applied to a power device or a light emitting device including, for example, a nitride semiconductor. However, embodiments are not limited thereto.

Referring to FIG. 1, the semiconductor device 100 includes a substrate 110, an active layer 150, and a buffer structure arranged between the substrate 110 and the active layer 150.

The substrate may include various materials. For example, the substrate 110 may include at least one of Si, SiC, a silicon on insulator (SOI), GaN, GaAs, InP, diamond, and a Ge on insulator (GOI). However, embodiments are not limited thereto.

The active layer 150 may include a nitride semiconductor. For example, the active layer 150 may include a GaN-based material. In this case, the active layer 150 may include an undoped GaN-based material or may include a doped GaN-based material in which desired and/or alternatively predetermined impurities are doped. As a specific example, the active layer 150 may include AlGaN/GaN.

The buffer structure 130 is provided between the substrate 110 and the active layer 150 including a nitride semiconductor. The buffer structure 130 may be provided to reduce and/or minimize defects caused by differences in characteristics (e.g., differences in lattice constants, differences in thermal expansion coefficients, etc.) between a substrate material and a nitride semiconductor.

Figure 2:
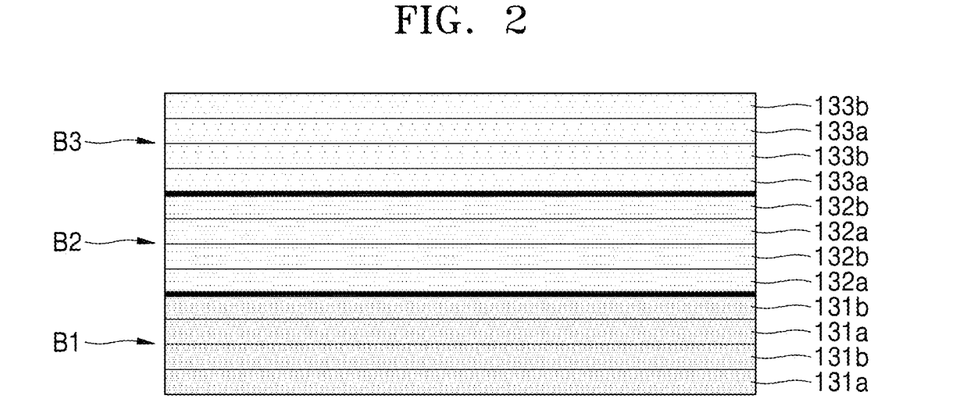
FIG. 2 illustrates a plurality of buffer layers shown in FIG. 1 in detail.

The buffer structure 130 may include a plurality of buffer layers. In FIG. 1, a case in which first, second, and third buffer layers B1, B2, and B3 are stacked on each other (e.g., sequentially stacked) on the substrate as an example is illustrated. FIG. 2 illustrates a plurality of buffer layers shown in FIG. 1 in detail.

Referring to FIGS. 1 and 2, the plurality of buffer layers include the first, second, and third buffer layers B1, B2, and B3 which are stacked on each other (e.g., sequentially stacked) on the substrate. Here, each of the first, second, and third buffer layers may include a semiconductor material having a super lattice structure. The super lattice structure refers to a lattice structure in which different materials are alternately arranged.

The first, second, and third buffer layers B1, B2, and B3 may include doped nitride semiconductors. The first, second and third buffer layers B1, B2, and B3 may include one or more materials selected from nitride containing at least one of Al, Ga, and In. For example, the first, second, and third buffer layers B1, B2, and B3 may include at least one of AlN, GaN, AlGaN, InGaN, AlInN, and AlGaInN. As a specific example, the first, second, and third buffer layers B1, B2, and B3 may include AlGaN. However, embodiments are not limited thereto. Each of the first, second, and third buffer layers B1, B2, and B3 may have a thickness, for example, greater than about 0 and less than about 50000 nm.

The first, second, and third buffer layers B1, B2, and B3 may be doped with desired and/or alternatively predetermined dopants. The dopant used for doping the first, second, and third buffer layers B1, B2, B3 may include, for example, at least one of Mg, C, O, and Al. However, this is merely an example. The doping concentration may be greater than or equal to about $10^{17}$ cm$^{-3}$ and less than or equal to about $10^{21}$ cm$^{-3}$. However, embodiments are not limited thereto.

The first, second, and third buffer layers B1, B2, and B3 may include nitride semiconductors having different compositions. In addition, the buffer layers adjacent to each other (e.g., the first and second buffer layers, or the second and third buffer layers) may have different doping concentrations.

Each of the first, second, and third buffer layers B1, B2, and B3 may include a plurality of sub-buffer layers with different compositions as illustrated in FIG. 2. The first buffer layer may have a structure in which first and second sub-buffer layers 131a and 131b having different compositions are alternately stacked. For example, the first sub-buffer layer 131a may include $Al_aGa_{1-a}N$ (0<a<1), and the second sub-buffer layer 131b may include $Al_bGa_{1-b}N$ (0<b<1, b≠a). Here, the first and second sub-buffer layers 131a and 131b constituting the first buffer layer B1 may have a first doping concentration.

One of the first and second sub-buffer layers 131a and 131b constituting the first buffer layer B1 may be a well layer, and the other may be a barrier layer. When the first buffer layer B1 includes AlGaN, the first buffer layer B1 may be divided into a well layer and a barrier layer according to a component ratio of Al. For example, in the barrier layer, the component ratio of Al may be higher than the component ratio of Ga, and in the well layer, the component ratio of Al may be lower than the component ratio of Ga.

The second buffer layer B2 may include a nitride semiconductor having a composition different from that of the first buffer layer B1. The second buffer layer B2 may have a structure in which third and fourth sub-buffer layers 132a and 132b having different compositions are alternately stacked. For example, the third sub-buffer layer 132a may include $Al_cGa_{1-c}N$ (0<c<1), and the fourth sub-buffer layer 132b may include $Al_dGa_{1-d}N$ (0<d<1, d≠c). Here, the third and fourth sub-buffer layers 132a and 132b constituting the second buffer layer B2 may have a second doping concentration different from the first doping concentration.

The third buffer layer B3 may include a nitride semiconductor having a composition different from those of the first and second buffer layers. The third buffer layer B3 may have a structure in which fifth and sixth sub-buffer layers 133a and 133b having different compositions are alternately stacked. For example, the fifth sub-buffer layer 133a may include $Al_eGa_{1-e}N$ (0<e<1), and the sixth sub-buffer layer 133b may include $Al_fGa_{1-f}N$ (0<f<1, f≠e). Here, the fifth and sixth sub-buffer layers 133a and 133b constituting the third buffer layer B3 may have a third doping concentration different from the second doping concentration. The first, second and third buffers described above may be formed through multi-step growth by multiple doping conditions, not a single doping condition. For example, the first buffer layer B1 may be formed by growing the first and second sub-buffer layers 131a and 131b to have a first doping concentration under a first doping condition. In addition, the second buffer layer B2 may be formed by growing the third and fourth sub-buffer layers 132a and 132b to have a second doping concentration under a second doping condition different from the first doping condition. In addition, the third buffer layer B3 may be formed by growing the fifth and sixth sub-buffer layers 133a and 133b to have a third doping concentration under a third doping condition different from the second doping condition.

Although a case in which each of the first, second, and third buffer layers includes two sub-buffer layers has been described above, the first, second, and third buffer layers may have a multi-layered structure including three or more sub-buffer layers. Meanwhile, each of the first, second, and third buffer layers may have a single layer structure.

The first, second, and third buffer layers B1, B2, and B3 may be formed by, for example, metal organic chemical vapor deposition (MOCVD), a hydride vapor phase epitaxy (HVPE), a molecular beam epitaxy (MBE), and the like. However, this is merely an example.

The doping of the first, second, and third buffer layers B1, B2, and B3 may be carried out by, for example, an ion implantation process, an in-situ process, a plasma deposition process, a diffusion process, or the like. However, this is merely an example.

As described above, the first, second, and third buffer layers B1, B2, and B3 may include a nitride semiconductor having a super lattice structure, and may be formed so that doping concentrations are gradually changed through multi-step growth according to a plurality of doping conditions. Accordingly, stress between the substrate 110 and the active layer 150 may be gradually released, and strain due to a difference in physical properties between the substrate 110 and the active layer 150 may be effectively reduced. In addition, the crystallinity of the buffer layers may be improved due to multi-step growth, and cracks in the buffer layers may be limited and/or suppressed. In addition, by adjusting the doping concentration of each buffer layer, a doping profile suitable for the performance of the active layer of the semiconductor device may be implemented.

The buffer structure 130 may further include a first material layer 121 provided between the substrate 110 and the plurality of buffer layers B1, B2, and B3. Here, the first material layer 121 may be provided to effectively reduce defects that may occur between the substrate 110 and the plurality of buffer layers. The first material layer 121 may include a nitride semiconductor. As a specific example, the nitride semiconductor may include, but is not limited thereto, at least one of AlN, GaN, AlGaN, InGaN, AlInN and AlGaInN.

In addition, the buffer structure 130 may further include a second material layer 122 provided between the active layer 150 and the plurality of buffer layers B1, B2, and B3. Here, the second material layer 122 may be provided to effectively reduce defects that may occur between the active layer and the plurality of buffer layers. The second material layer 122 may include a nitride semiconductor. The nitride semiconductor may include, but is not limited thereto, at least one of AlN, GaN, AlGaN, InGaN, AlInN and AlGaInN.

Figure 3:
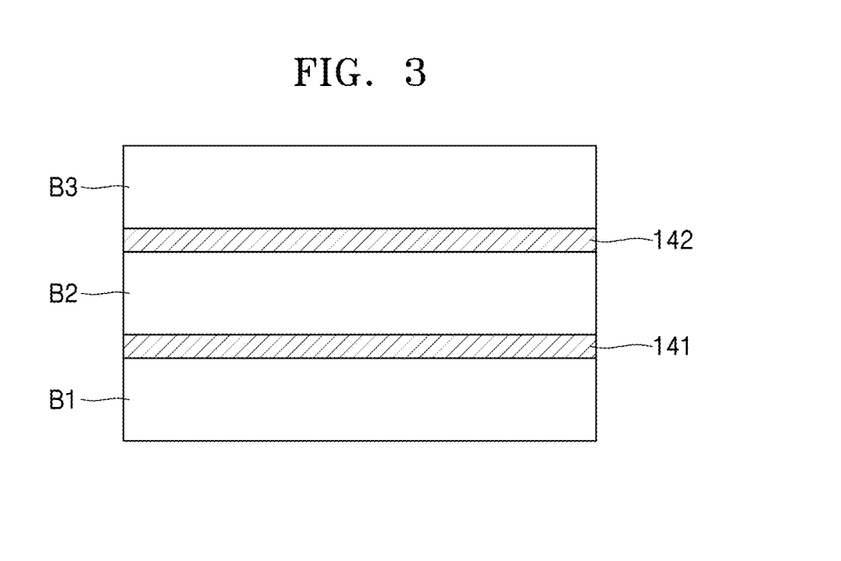
FIG. 3 illustrates a buffer structure according to another example embodiment.

FIG. 3 illustrates a buffer structure according to another example embodiment.

Referring to FIG. 3, the buffer structure 130 includes a plurality of buffer layers and at least one intermediate layer provided between the buffer layers. The plurality of buffer layers may include first, second, and third buffer layers B1, B2, and B3 stacked on each other (e.g., sequentially stacked) on the substrate. The first, second, and third buffer layers B1, B2, and B3 have been described in detail in the above-described embodiment, and thus descriptions thereof will be omitted.

A first intermediate layer 141 may be provided between the first buffer layer B1 and the second buffer layer B2, and a second intermediate layer 142 may be provided between the second buffer layer B2 and the third buffer layer B3. Each of the first and second intermediate layers may include a doped nitride semiconductor. For example, each of the first and second intermediate layers may include at least one of AlN, GaN, AlGaN, InGaN, AlInN, AlGaInN, and the like, but is not limited thereto.

The first intermediate layer 141 may have the same doping concentration as the adjacent buffer layer (e.g., the first or second buffer layer). However, embodiments are not limited thereto, and the first intermediate layer 141 may have a doping concentration different from those of the first and second buffer layers. The second intermediate layer 142 may have the same doping concentration as the adjacent buffer layer (second or third buffer layer). However, embodiments are not limited thereto, and the second intermediate layer 142 may have a doping concentration different from those of the second and third buffer layers.

Meanwhile, in the above description, a case in which the first intermediate layer 141 is provided between the first and second buffer layers B1 and B2, and the second intermediate layer 142 is provided between the second and third buffer layers B2 and B3 has been described. However, embodiments are not limited thereto, and an intermediate layer may be provided only between the first and second buffer layers or between the second and third buffer layers.

Each of the first and second intermediate layers 141 and 142 may have a thickness of about 50 nm to about 500 nm. However, embodiments are not limited thereto.

In the above-described embodiments, a case in which the buffer structure 130 includes three first, second, and third buffer layers B1, B2, and B3 has been described. However, this is merely an example and the buffer structure 130 may include two or four more buffer layers having different compositions.

Figure 4:
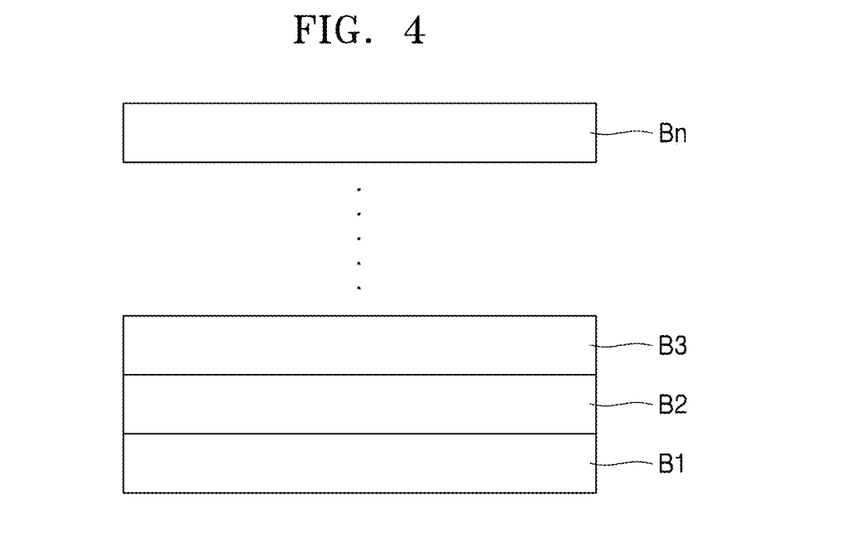
FIG. 4 illustrates a buffer structure according to another example embodiment.

FIG. 4 illustrates a buffer structure 130 according to another example embodiment. In FIG. 4, a case in which the buffer structure has n buffer layers including three buffer layers is illustrated.

Referring to FIG. 4, the buffer structure 130 may include n (n≥2) first, second, and, . . . , and nth buffer layers, which are stacked on each other (e.g., sequentially stacked) on a substrate. Here, each of the buffer layers may have a super lattice structure and may include a doped nitride semiconductor. The buffer layers may include one or more materials selected from nitrides including at least one of Al, Ga, and In. For example, the buffer layers may include at least one of AlN, GaN, AlGaN, InGaN, AlInN, and AlGaInN. Each of these buffer layers may have a thickness of, for example, greater than about 0 and less than about 50000 nm.

Each of the n buffer layers may be doped with a desired and/or alternatively predetermined dopant. Here, a dopant used for doping the buffer layers may include at least one of Mg, C, O, and Al. The doping concentration of the dopant may be greater than or equal to about $10^{17}$ cm$^{-3}$ and less than or equal to about $10^{21}$ cm$^{-3}$.

The n buffer layers may include nitride semiconductors having different compositions, and adjacent buffer layers may have different doping concentrations. Each of then buffer layers may include a plurality of sub-buffer layers having different compositions. These n buffer layers may be formed through multi-step growth under a plurality of doping conditions.

Meanwhile, although not shown in the drawings, at least one intermediate layer may be further provided between n buffer layers. In this case, the number of intermediate layers provided between n buffer layers may be up to n−1. Each intermediate layer may include a doped nitride semiconductor. Here, each intermediate layer may have the same doping concentration as the adjacent buffer layer or a doping concentration different from that of the adjacent buffer layer.

FIGS. 5A to 5D illustrate, in some examples, doping concentration profiles of the buffer layers shown in FIG. 4. FIGS. 5A to 5D illustrate a case where a buffer structure includes five first, second, third, fourth, and fifth buffer layers, which are stacked on each other (e.g., sequentially stacked) on a substrate.

Figure 5A:
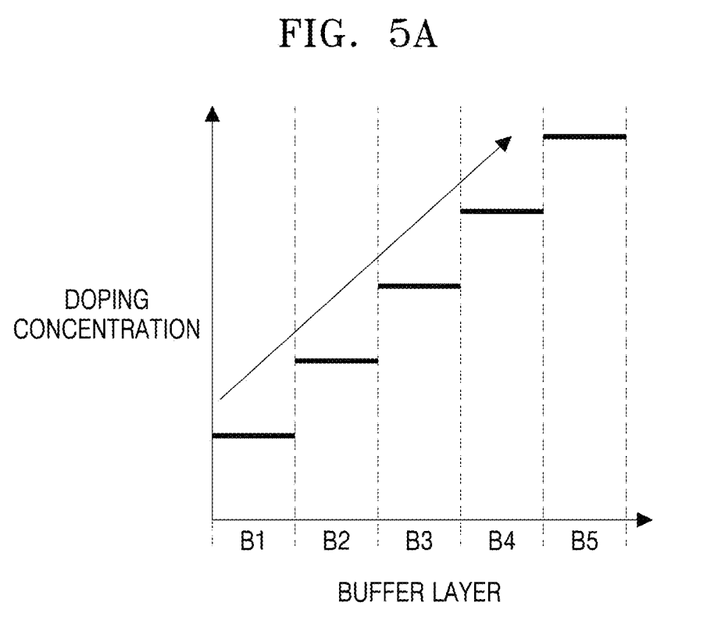
FIGS. 5A to 5D illustrate, in some examples, doping concentration profiles of buffer layers shown in FIG. 4.
Figure 5B:
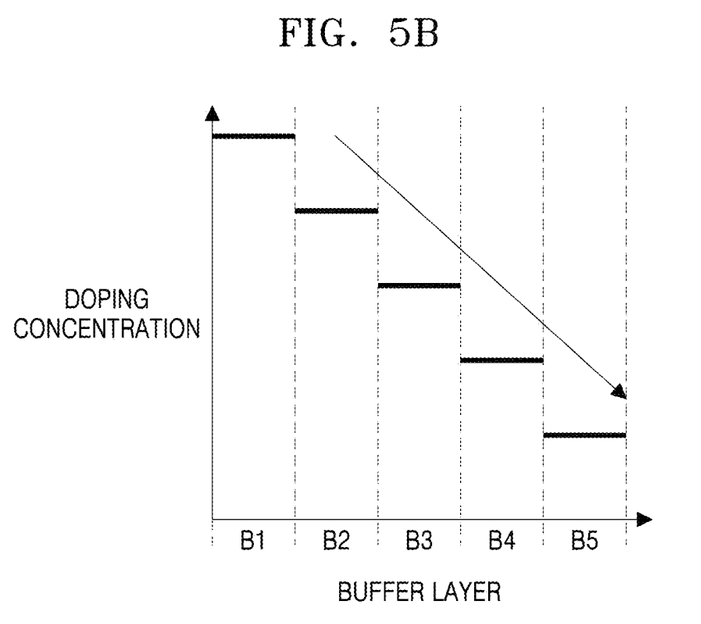
Figure 5C:
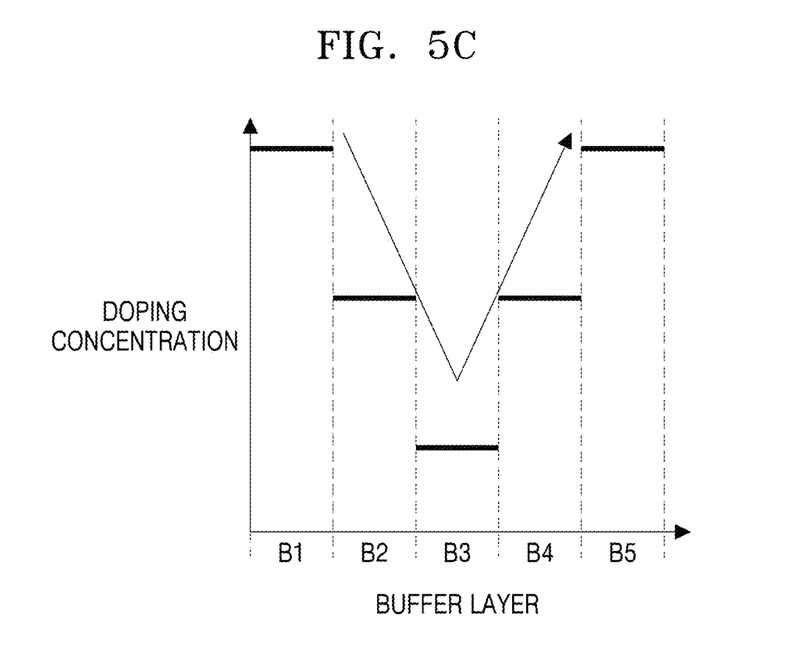
Figure 5D:
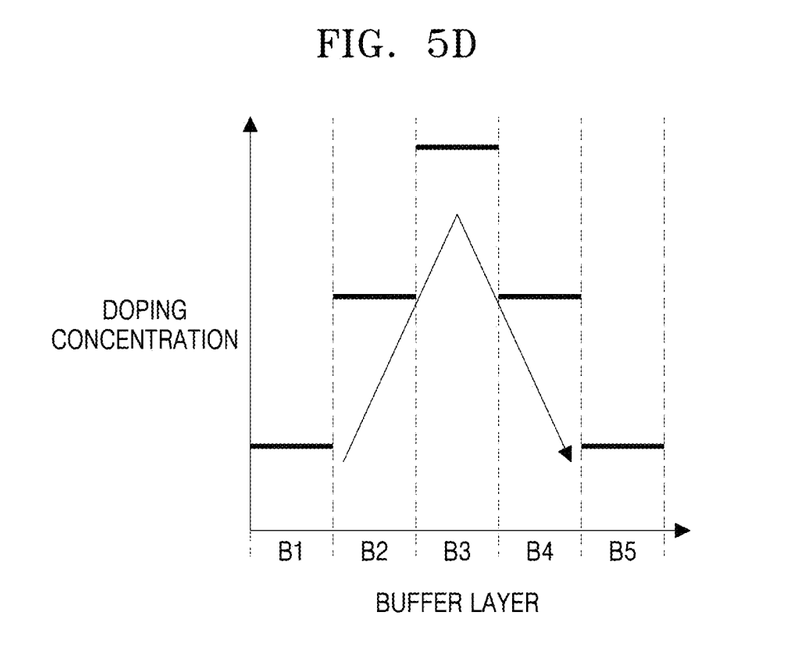

Referring to FIGS. 5A to 5D, buffer layers adjacent to each other have different doping concentrations. For example, FIG. 5A shows the case where the doping concentrations of the buffer layers increase linearly toward the upper side of the substrate, and FIG. 5B shows the case where the doping concentrations of the buffer layers decrease linearly toward the upper side of the substrate. FIG. 5C shows the case where the doping concentrations of the buffer layers decrease and then increase toward the upper side of the substrate, and FIG. 5D shows the case where the doping concentrations of the buffer layers increase and then decrease toward the upper side of the substrate.

Referring to FIGS. 5A to 5D, in three buffer layers adjacent to each other, a doping concentration of a second one of the three buffer layers may be in a range between a doping concentration of a first and a third one of the three buffer layers. For example, in FIGS. 5A to 5D, a doping concentration of the buffer layer B2 may be between doping concentrations of buffer layers B1 and B3.

Referring to FIGS. 5C and 5D, in three buffer layers adjacent to each other, a doping concentration of a first one and a third one of the three buffer layers may be equal to each other. For example, in FIGS. 5C and 5D, buffer layers B2 and B4 may have equal doping concentrations.

The doping concentration profiles shown in FIGS. 5A to 5D are merely an example, and in addition, the doping concentration profiles may be modified in various forms. That is, a doping profile suitable for the performance of the active layer of the semiconductor device may be implemented by adjusting the doping concentrations of the buffer layers.

Figure 6:
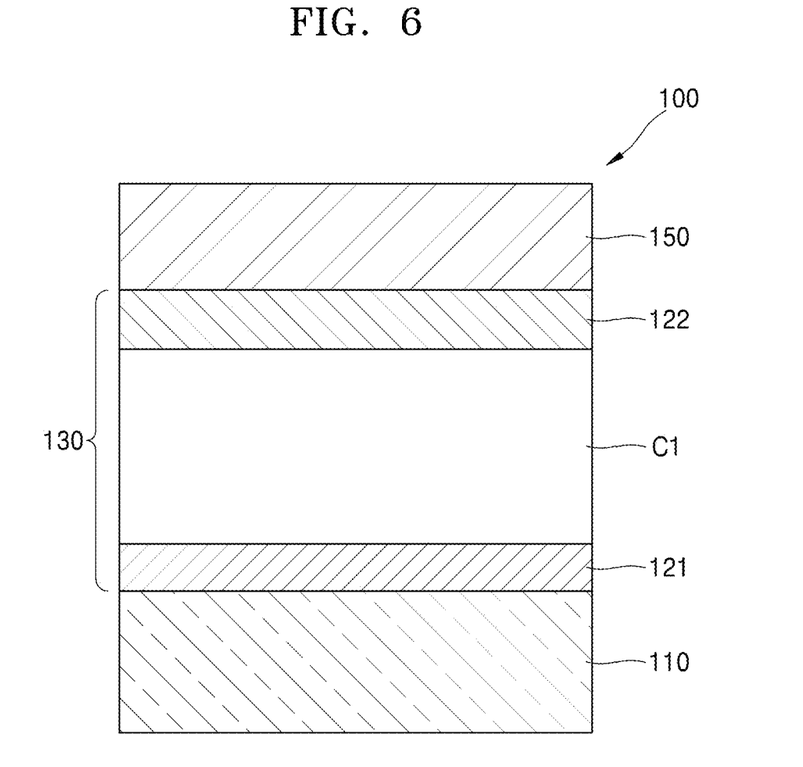
FIG. 6 illustrates, as an example, a case where a single buffer layer C1 is stacked on a substrate.

Referring to FIG. 6, the semiconductor device 100 includes a substrate 110, an active layer 150, and a buffer structure arranged between the substrate 110 and the active layer 150.

The buffer structure 130 is provided between the substrate 110 and the active layer 150 including a nitride semiconductor. The buffer structure 130 may be provided to reduce and/or minimize defects caused by differences in characteristics (e.g., differences in lattice constants, differences in thermal expansion coefficients, etc.) between a substrate material and a nitride semiconductor.

The buffer structure 130 may include a single buffer layer. FIG. 6 illustrates, in an example, the case where a single buffer layer Cl is stacked on a substrate.

Referring to FIG. 6, the buffer structure includes a single buffer layer Cl on a substrate. Here, the single buffer layers may include a semiconductor material having a super lattice structure. The super lattice structure refers to a lattice structure in which different materials are alternately arranged. The single buffer layer Cl may have a same composition throughout a whole of the single buffer layer.

Figure 7A:
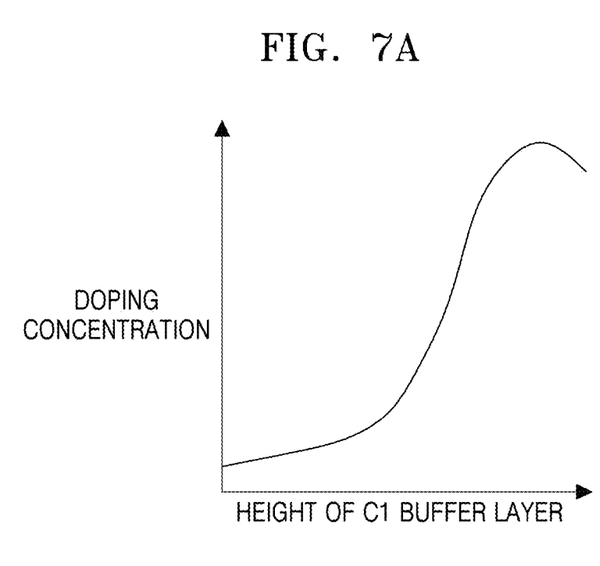
FIGS. 7A to 7C illustrate, as some examples, doping concentration profiles of the buffer layer shown in FIG. 6.
Figure 7B:
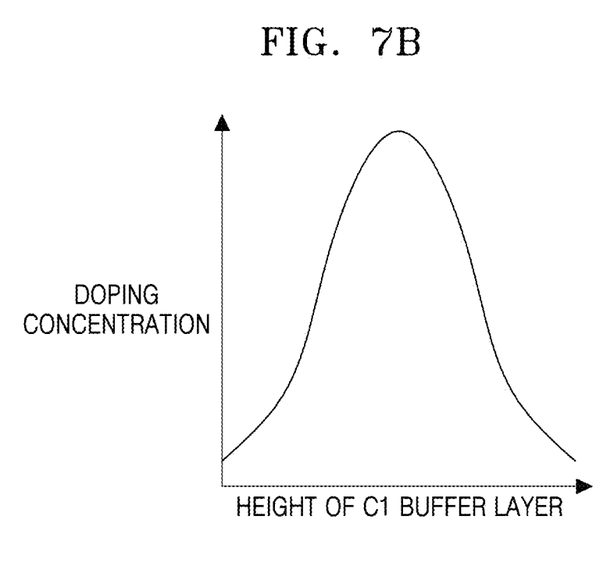
Figure 7C:
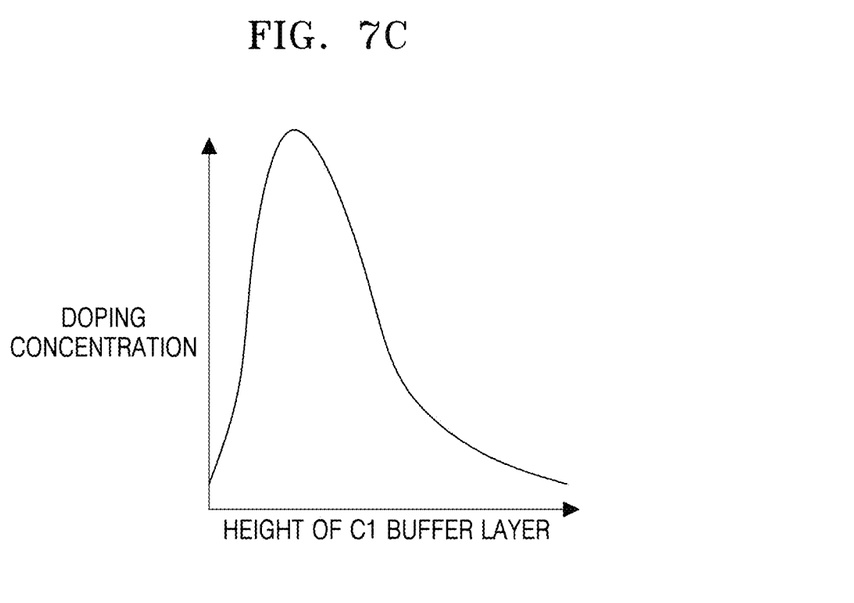

FIGS. 7A to 7C illustrate, in some examples, doping concentration profiles of the buffer layers shown in FIG. 6.

Referring to FIGS. 7A to 7C, the single buffer layer Cl may include continuous doping concentrations in the buffer layer. The doping concentration may vary according to the height of the single buffer layer C 1. For example, referring to FIG. 7A, a doping concentration peak is shown on top of the single buffer layer Cl.

Similarly, referring to FIG. 7B, a case of having a doping concentration peak in the middle of the single buffer layer Cl is illustrated.

Referring to FIG. 7C, a case of having a doping concentration peak on the bottom of the single buffer layer Cl is illustrated.

The doping concentration profiles shown in FIGS. 7A to 7C are merely an example, and in addition, the doping concentration profiles may be modified in various forms. That is, a doping profile suitable for the performance of the active layer of the semiconductor device may be implemented by adjusting the doping concentration according to the height of the single buffer layer.

The buffer structure provided between the substrate and the active layer may include the plurality of buffer layers each having a super lattice structure, and the plurality of buffer layers may be grown such that the doping concentration is gradually changed from the bottom to the top by multi-step growth according to different doping concentrations. Accordingly, the stress between the substrate and the active layer may be released step by step, and the strain due to the difference in physical properties between the substrate and the active layer may be effectively reduced. In addition, the crystallinity of the buffer layers may be improved due to multi-step growth, and cracks in the buffer layers may be limited and/or suppressed. In addition, by adjusting the doping concentration of each buffer layer, a doping profile suitable for the performance of the active layer of the semiconductor device may be implemented.

Buffer structures according to example embodiments and semiconductor devices including the same may be applied to various devices.

Figure 8A:
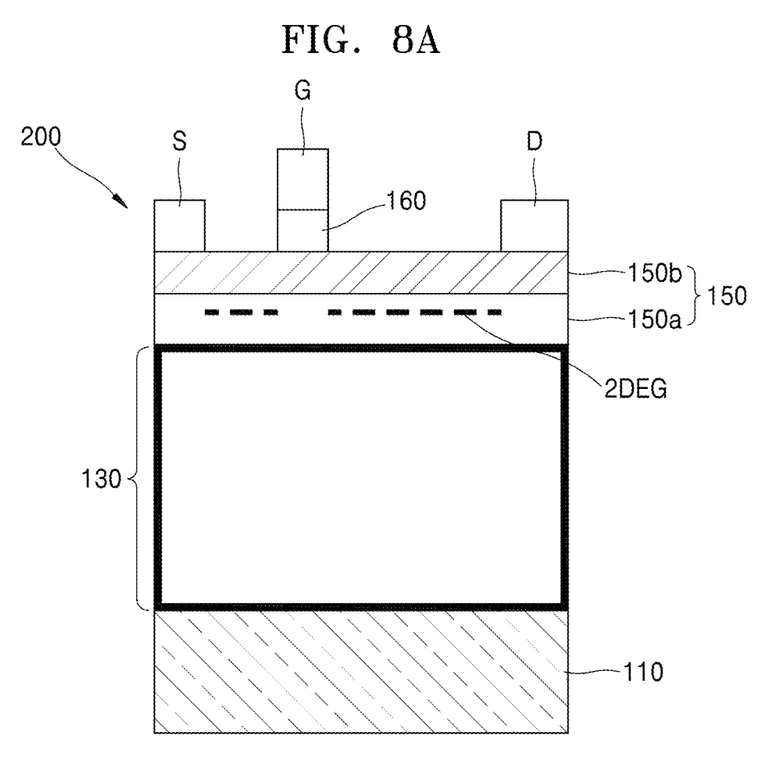
FIG. 8A illustrates a power device including a buffer structure according to an example embodiment.

For example, FIG. 8A illustrates a power device including a buffer structure according to an example embodiment.

Referring to FIG. 8A, a power device 200 according to an example embodiment may include a substrate 110, a buffer structure 130, an active layer 150 stacked on each other on the substrate 110. The buffer structure 130 may include one of the buffer structures 130 described in FIGS. 1-4 and 6. The buffer layers in the buffer structure 130 may have doping concentration profiles according to any one of FIGS. 5A to 5D and 7A to 7C. The active layer 150 may include a channel layer 150a and a channel supply layer 150b on the channel layer 150a. The channel layer 150a and channel supply layer 150b may include different GaN-based materials. As one example, the channel layer 150a may include GaN or a doped GaN layer and the channel supply layer may include AlGaN, but example embodiments are not limited thereto. A source electrode S, a gate electrode G, and a drain electrode D may be spaced apart from each other on the active layer 150. In some embodiments, a p-type nitride semiconductor layer 160 may be formed between the gate electrode G and the active layer 150. The channel supply layer 150b may induce a two-dimensional gas (2DEG) layer in the channel layer 150a. A depletion region, where the 2DEG is not present if no voltage is applied to the gate electrode G, may be formed under the p-type nitride semiconductor layer 160. The p-type nitride semiconductor layer 160 may include a same material as the channel layer 150a, but example embodiments are not limited thereto. The source electrode S, gate electrode G, and drain electrode D may be formed of conductive materials, such as a metal or a metal alloy.

Figure 8B:
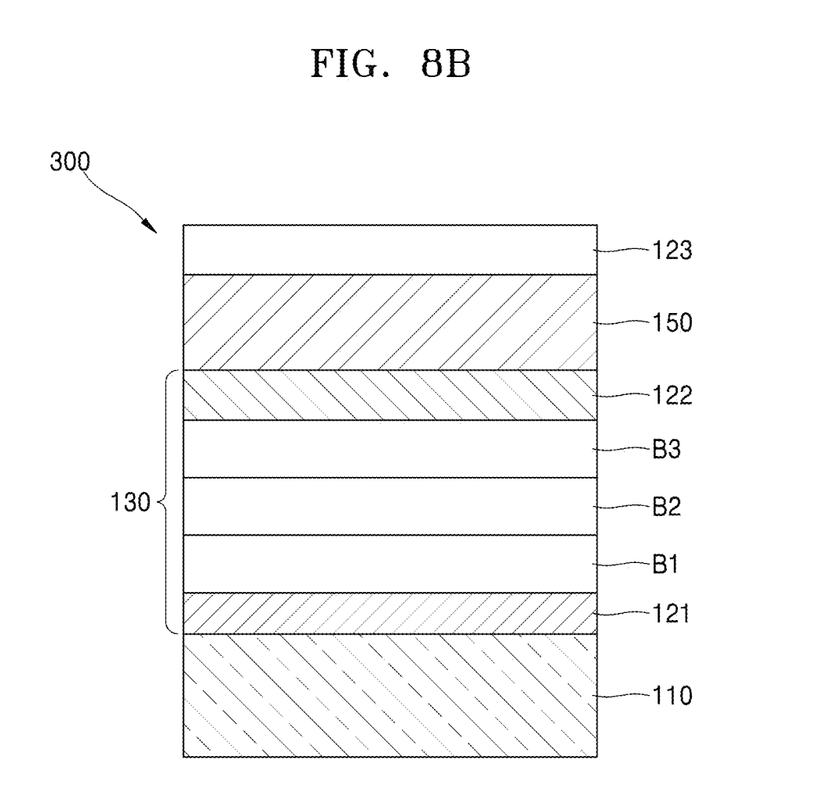
FIGS. 8B and 8C illustrate light emitting devices including a buffer structure according to some example embodiments.
Figure 8C:
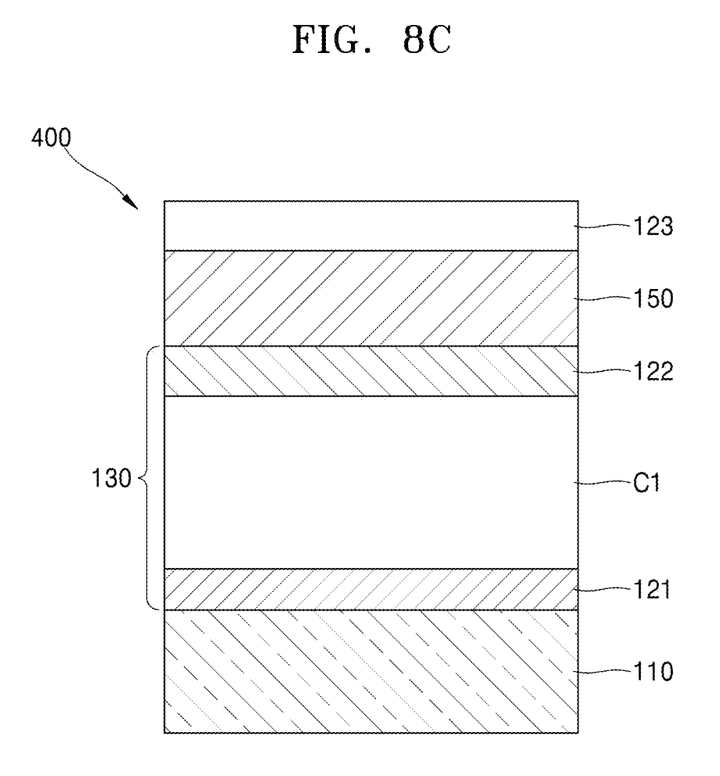

As another example, FIGS. 8B and 8C illustrate light emitting devices including a buffer structure according to some example embodiments.

Referring to FIGS. 8B and 8C, light emitting devices 300 and 400 may include a substrate 110, a buffer structure 130 on the substrate, an active layer 150 on the buffer structure, and a third material layer 123 on the active layer. The light emitting device 300 in FIG. 8B may include the buffer structure 130 described in FIGS. 1-4 and the buffer layers in the buffer structure 130 of the light emitting device 300 may have doping concentration profiles according to any one of FIGS. 5A to 5D. The light emitting device 400 in FIG. 8C may include the buffer structure 130 described in FIG. 6 and the buffer layers in the buffer structure 130 of the light emitting device 400 may have doping concentration profiles according to any one of FIGS. 7A to 7C.

In the light emitting devices 300 and 400, the second material layer 122 may be doped with a n-type impurity (e.g., formed of n-GAN) and the third material layer 123 may include a nitride semiconductor doped with a p-type impurity (e.g., p-GaN). The third material layer 123 may have a same composition as the second material layer 122, but a different conductivity type. However, example embodiments are not limited thereto.

Figure 9:
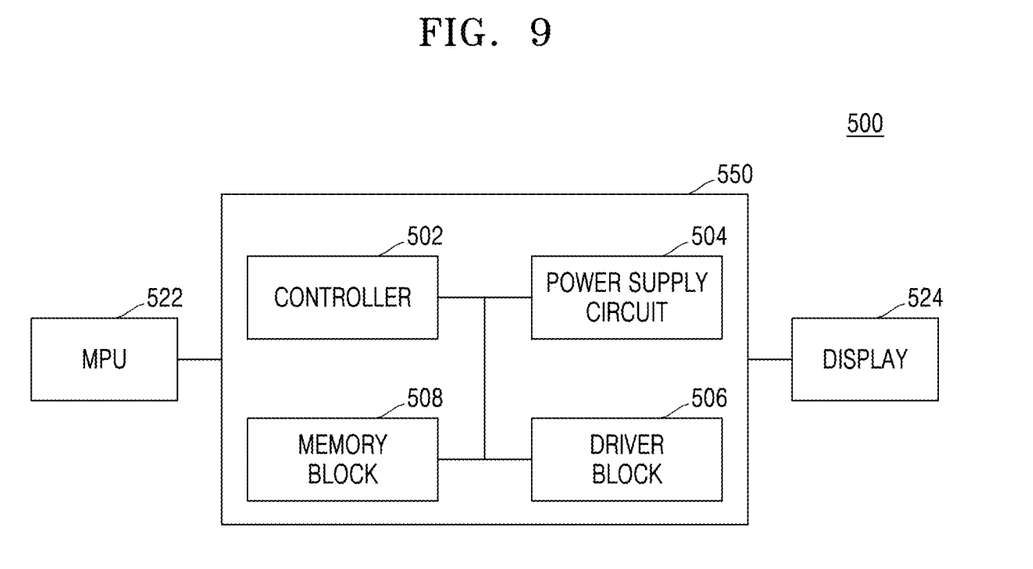
FIG. 9 illustrates a block diagram of an electronic system including a semiconductor device according to an example embodiment.

As another example, FIG. 9 illustrates a block diagram of an electronic system 500 including a semiconductor device according to an example embodiment.

Referring to FIG. 9, the electronic system 500 may include an integrated circuit (IC) 550, such as a display-driver integrated circuit (DDI), and the IC may include a controller 502, a power supply circuit 504, a driver block 506, and a memory block 508. The controller 502 receives and decodes a command applied from a main processor (MPU) 522, and controls each block of the IC 550 to implement an operation according to the command. The power supply circuit 504 generates a driving voltage in response to the control of the controller 502. The driver block 506 drives a display apparatus 524 using the driving voltage generated by the power supply circuit unit 504 in response to the control of the controller 502. The display apparatus 524 may be a LED display, but is not limited thereto. The memory block 508 is a block for temporarily storing commands input to the controller 502 or control signals output from the controller 502 or for storing necessary data, and may include a memory (e.g., DRAM, Flash Memory. The power supply circuit 504 may include the power device 200 in FIG. 8A or a different power device including one of the semiconductor devices 100 in FIGS. 1 and 6. The display 524 may include one of the light emitting devices 300 and 400 described in FIGS. 8B and 8C or a different light emitting device including one of the semiconductor devices 100 in FIGS. 1 and 6.

One or more of the elements disclosed above may include or be implemented in processing circuitry such as hardware including logic circuits; a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A power device comprising:
   a substrate;
   a buffer structure on the substrate;
   a channel layer on the buffer structure,
   a source electrode and a drain electrode on the channel layer,
   a gate electrode between the source electrode and the drain electrode, wherein the buffer structure has
   a plurality of buffer layers between the substrate and an active layer, the active layer including a nitride semiconductor,
   the plurality of buffer layers being stacked on each other on the substrate,
      each of the plurality of buffer layers having a super lattice structure and including a doped nitride semiconductor,
   wherein the plurality of buffer layers have different compositions from each other, and
   adjacent buffer layers from among the plurality of buffer layers have different doping concentrations from each other.

2. The power device of claim 1, wherein the plurality of buffer layers each comprise a plurality of sub-buffer layers having different compositions from each other.

3. The power device of claim 1, further comprising:
   a first material layer between the substrate and the plurality of buffer layers.

4. The power device of claim 3, wherein the first material layer comprises a first nitride semiconductor.

5. The power device of claim 1, further comprising:
   a second material layer between the active layer and the plurality of buffer layers.

6. The power device of claim 1, wherein each of the plurality of buffer layers comprises at least one of AlN, GaN, AlGaN, InGaN, AlInN, and AlGaInN.

7. The power device of claim 1, wherein the plurality of buffer layers are doped with at least one of Mg, C, O, and Al.

8. The power device of claim 1, wherein a doping concentration in the plurality of buffer layers is greater than or equal to about $10^{17}$ cm$^{-3}$ and less than or equal to about $10^{21}$ cm$^{-3}$.

9. The power device of claim 1, wherein a thickness of each buffer layer among the plurality of buffer layers is greater than 0 nm and less than about 5000 nm.

10. The power device of claim 1, wherein
    the substrate comprises at least one of Si, SiC, silicon on insulator (SOI), GaN, GaAs, InP, diamond, and Ge on insulator (GOI).

11. The power device of claim 1, further comprising:
    at least one intermediate layer between the plurality of buffer layers.

12. The power device of claim 1, wherein the plurality of buffer layers include a first buffer layer, a second buffer layer on the first buffer layer, and a third buffer layer on the second buffer layer, and a doping concentration in the second buffer layer is in a range between a doping concentration of the first buffer layer and a doping concentration of the third buffer layer.

13. The power device of claim 1, wherein the plurality of buffer layers include a first buffer layer, a second buffer layer on the first buffer layer, and a third buffer layer on the second buffer layer, and a doping concentration in the first buffer layer is equal to a doping concentration of the third buffer layer.

14. A semiconductor device comprising:

a substrate;

an active layer on the substrate, the active layer including a nitride semiconductor; and a buffer structure between the substrate and the active layer, wherein the buffer structure includes a plurality of buffer layers stacked on each other on the substrate, each of the plurality of buffer layers having a super lattice structure and including a doped nitride semiconductor, wherein the plurality of buffer layers have different compositions from each other, and adjacent buffer layers among the plurality of buffer layers have different doping concentrations from each other.

15. A power device comprising:

a substrate;

a buffer structure on the substrate;

a channel layer on the buffer structure, a source electrode and a drain electrode on the channel layer, a gate electrode between the source electrode and the drain electrode, wherein the buffer structure has a single buffer layer between the substrate and an active layer, the active layer including a nitride semiconductor, the single buffer layer having a super lattice structure and including a doped nitride semiconductor, wherein the single buffer layer has a same composition throughout a whole of the single buffer layer, and the single buffer layer has a doping concentration that varies continuously according to a height in the single buffer layer.

16. The power device of claim 15, further comprising:

a first material layer provided the substrate and the single buffer layer.

17. The power device of claim 16, wherein the first material layer comprises a first nitride semiconductor.

18. The power device of claim 15, further comprising:

a second material layer between the active layer and the single buffer layer.

19. The power device of claim 18, wherein the second material layer comprises a second nitride semiconductor.

20. A semiconductor device comprising:

the power device of claim 15, wherein the buffer structure is on the substrate and the active layer is on the buffer structure.

\* \* \* \* \*